(12) United States Patent
Hettler et al.

(10) Patent No.: US 11,367,692 B2
(45) Date of Patent: Jun. 21, 2022

(54) LENS CAP FOR A TRANSISTOR OUTLINE PACKAGE

(71) Applicant: SCHOTT AG, Mainz (DE)

(72) Inventors: Robert Hettler, Kumhausen (DE); Reinhard Ecker, Landshut (DE); Martin Lindner-Stettenfeld, Landshut (DE); Georg Mittermeier, Landshut (DE)

(73) Assignee: SCHOTT AG, Mainz (DE)

( * ) Notice: Subject to any disclaimer, the term of this patent is extended or adjusted under 35 U.S.C. 154(b) by 0 days.

(21) Appl. No.: 15/482,357

(22) Filed: Apr. 7, 2017

(65) Prior Publication Data

US 2017/0294390 A1    Oct. 12, 2017

(30) Foreign Application Priority Data

Apr. 7, 2016 (DE) .................... 102016106366.5

(51) Int. Cl.
| | |
|---|---|
| *G02B 7/02* | (2021.01) |
| *H01L 23/00* | (2006.01) |
| *H01L 23/04* | (2006.01) |
| *H01L 23/06* | (2006.01) |
| *H01L 23/08* | (2006.01) |
| H01L 31/0203 | (2014.01) |
| H01L 31/0232 | (2014.01) |
| H01S 5/02212 | (2021.01) |

(52) U.S. Cl.
CPC .......... *H01L 23/564* (2013.01); *H01L 23/041* (2013.01); *H01L 23/06* (2013.01); *H01L 23/08* (2013.01); H01L 31/0203 (2013.01); H01L 31/02325 (2013.01); H01S 5/02212 (2013.01)

(58) Field of Classification Search
CPC ...... G02B 3/00; G02B 3/0018; G02B 3/0068; G02B 6/2552; H01L 31/0203; H01L 31/02325; H01L 33/483; H01L 33/58; H01L 2224/48091
USPC .......................... 359/811, 815, 819; 362/267
See application file for complete search history.

(56) References Cited

U.S. PATENT DOCUMENTS

| | | |
|---|---|---|
| 3,155,748 A | 11/1964 | Couri |
| 4,940,855 A | 7/1990 | Waitl |
| 5,048,238 A | 9/1991 | Ikeda |
| 5,235,153 A | 8/1993 | Woelfl |
| 5,626,641 A | 5/1997 | Yonemoto |

(Continued)

FOREIGN PATENT DOCUMENTS

| | | |
|---|---|---|
| DE | 10247315 | 12/2005 |
| DE | 102012106289 | 1/2014 |

(Continued)

OTHER PUBLICATIONS

En.wikipedia.org. 2020. Kovar, [online] Available at: <https://en.wikipedia.org/wiki/Kovar> [Accessed Jul. 15, 2020], (Year: 2015).*

*Primary Examiner* — Mahidere S Sahle
(74) *Attorney, Agent, or Firm* — Ohlandt, Greeley, Ruggiero & Perle, L.L.P.

(57) ABSTRACT

A lens cap for a transistor outline (TO) package is provided that has an inner diameter of less than 4 mm. The lens cap includes a metal shell with a wall thickness of less than 0.2 mm and a thinned area surrounding the lens so that in the thinned area the wall thickness is reduced by at least 35%.

20 Claims, 2 Drawing Sheets

(56) References Cited

U.S. PATENT DOCUMENTS

| | | |
|---|---|---|
| 5,665,135 A | 9/1997 | Izumitani |
| 2003/0081897 A1 | 5/2003 | Itoh |
| 2006/0110104 A1 | 5/2006 | Sakai |
| 2010/0025846 A1* | 2/2010 | Nishiyama .......... H01L 31/0203 257/729 |
| 2012/0094821 A1 | 4/2012 | Schenk |
| 2014/0016206 A1 | 1/2014 | Hettler |

FOREIGN PATENT DOCUMENTS

| | | |
|---|---|---|
| DE | 102012106290 | 1/2014 |
| JP | S58185445 | 10/1983 |
| JP | S6084913 U | 6/1985 |
| JP | S6148435 | 3/1986 |
| JP | S61281033 | 12/1986 |
| JP | S6283334 | 4/1987 |
| JP | S6283337 | 4/1987 |
| JP | S62151775 | 9/1987 |
| JP | S62151775 U | 9/1987 |
| JP | S63255984 | 10/1988 |
| JP | S6417011 | 1/1989 |
| JP | S6479023 | 3/1989 |
| JP | H03114278 A | 5/1991 |
| JP | H0436135 | 8/1992 |
| JP | 06201962 A * | 7/1994 |
| JP | H06201962 | 7/1994 |
| JP | 2000106406 | 4/2000 |
| JP | 2003206143 | 7/2003 |
| JP | 2004047831 | 2/2004 |
| JP | 2006106504 | 4/2006 |
| JP | 2006126272 | 5/2006 |
| JP | 2008300664 | 12/2008 |
| JP | 2009245975 A | 10/2009 |
| JP | 2010175341 | 8/2010 |

* cited by examiner

LENS CAP FOR A TRANSISTOR OUTLINE PACKAGE

CROSS REFERENCE TO RELATED APPLICATION

This application claims benefit under 35 U.S.C. § 119(a) of German Patent Application No. 10 2016 106 366.5 filed April, 2016, the entire contents of which are incorporated herein by reference.

BACKGROUND

1. Field of the Invention

The invention relates to a lens cap for a transistor outline (TO) package and to a TO package equipped with a lens cap. More particularly, the invention relates to a round metal package according to the TO-33 or TO-38 standard (according to JEDEC).

2. Description of Related Art

Transistor outline (TO) packages are known. They are available in various designs. Such a TO package for high-frequency applications comprising a lens cap is known from patent document DE 102 47 315 B4 (Schott AG), for example.

Such hermetically encapsulated packages are in particular used to accommodate laser diodes and photodiodes. For this purpose, the package has a window which may in particular be designed in form of a lens.

In particular TO packages with a fused glass lens are known from practice. Such packages are distinguished by high temperature resistance. The lens cap usually merely consists of a deep drawn component with an opening into which the lens is fused. This deep drawn component can be welded or soldered to the header of the TO package.

Such lens caps are stable, gas-tight, and exhibit high temperature resistance.

In particular TO-52 type packages are known from practice. For smaller packages, however, it is difficult with increasing miniaturization to provide a sufficiently stable bond between the lens and the shell without risk for the lens of being blasted off when the shell is subjected to mechanical stress, for example when the TO package is mounted or when the lens cap is assembled.

SUMMARY

Given this background, an object of the invention is to provide a lens cap which is sufficiently robust in mechanical terms even in the case of small TO packages, in particular with an inner diameter of less than 4 mm.

The invention relates to a lens cap for a TO package. More particularly, the invention relates to a lens cap for a TO-33 or TO-38 type TO package.

The lens cap has an inner diameter of less than 4 mm, preferably less than 3.8 mm. Preferably, the lens cap has a substantially circular cylindrical shape. Should the lens cap not have a circular cylindrical shape, the inner diameter refers to the smallest inner diameter of the lens cap.

The lens cap comprises a metal shell.

The metal shell is in particular provided as a deep drawn component.

The metal shell has a wall thickness of less than 0.2 mm, preferably less than 0.15 mm, at least at the base wall of the lens cap. The lateral walls of the metal shell preferably also have a wall thickness of less than 0.2 mm, preferably less than 0.15 mm.

The metal shell has an opening in its base wall, in which a lens is seated.

The invention in particular relates to metal shells with a fused lens, that is to say in which for providing a lens a glass gob is placed on the opening, the component is heated until the glass softens and bonds to the metal shell.

The wall of the shell includes a thinned area surrounding the opening in which the lens is seated, and in the thinned area so provided the wall thickness is reduced by at least 35%.

Thus, the metal shell is thinned, i.e. has a smaller wall thickness, around to the opening in which the lens is located.

It has been found that with such a thinning, stresses between the components are reduced to a surprisingly high degree, which considerably reduces the risk for the lens of being ejected under mechanical stress. Surprisingly, the stresses in the glass of the lens and at the glass-metal interface are apparently considerably reduced by the thinned area with a depth according to the invention, whereby the stability of the lens cap is considerably improved.

Preferably, the wall thickness in the thinned area is reduced by at least 40%, more preferably by at least 45%.

However, the wall thickness in the thinned area is preferably at least 10%, more preferably at least 20%, of the adjacent wall of the shell.

For easy manufacturing of the thinned area, the latter is preferably provided in the form of an impression, in particular an impression in a deep drawn component. So, the impression can be introduced simultaneously with the shaping of the metal shell in a single processing step.

In one embodiment of the invention, the thinned area is formed as a groove extending around the lens.

It is in particular contemplated that the groove extending around the lens has a flat bottom.

According to another embodiment, the bottom may as well have a rounded cross-sectional shape.

It has been found that a groove with a small width is already sufficient to considerably reduce stresses in the area around the lens, in particular with a width of at least 0.02 mm, preferably 0.05 mm.

Due to the thinned area, the lens sits on a base. Preferably, the edge of the lens is spaced from the edge of the base by not more than 0.2 mm, more preferably not more than 0.3 mm. Most preferably, the lens body is essentially flush with the base on the surface of the lens cap.

In one embodiment of the invention, the thinned area is provided in the form of a flattening of the base wall of the metal shell extending around the lens.

In this embodiment of the invention, there is therefore no groove extending around the lens or around the base of the metal shell on which the lens is seated, rather, the entire base wall of the shell adjacent to the base is thinned compared to the base and preferably also compared to the lateral wall of the shell.

The metal shell preferably has a height of less than 4 mm. The lens preferably has an outer diameter from 1 to 2 mm, most preferably from 1.4 to 1.6 mm, outer diameter referring to the maximum diameter of the lens.

The opening in the base wall of the metal shell preferably has a diameter that is 40-60% of the outer diameter of the metal shell.

In a preferred embodiment of the invention, the metal shell is made of a material exhibiting a coefficient of linear thermal expansion a that differs by not more than 1 ppm/K from the coefficient of linear thermal expansion of the lens.

The metal shell is preferably made of a nickel-iron alloy, in particular a nickel-iron-cobalt alloy. In particular, the metal shell has a coefficient of linear thermal expansion between 4 and 6 ppm/K.

The coefficient of linear thermal expansion of the lens is preferably also between 4 and 6 ppm/K.

In a preferred embodiment, the lens is made of a borosilicate glass, in particular a borosilicate glass with a glass transition temperature $T_g$ of less than 600° C., preferably less than 550° C., most preferably less than 500° C. In this way, manufacture-related stresses are kept low.

The lens is advantageously designed so as to have a stepped cross-sectional shape in parallel to the main direction of electromagnetic radiation transmission through the lens.

Particularly advantageous are two lens sections having different diameters as measured perpendicularly to the main direction of electromagnetic radiation transmission through the lens. In a transition area between the two lens sections of different diameters, there is most advantageously a cylindrical section referred to as a lens stem.

Adjacent to the lens stem toward the larger diameter section, the lens has a bearing area with a surface preferably perpendicular to the lateral surface of the cylindrical section of the lens stem.

The outer edge of the bearing surface intersecting with the lens surface of the larger diameter lens section is referred to as lens edge. Thus, the bearing surface terminates at the lens edge. The lens edge may be located directly adjacent to the thinned area or may be spaced from the thinned area. In any case, the wall thickness of the metal shell is smaller in the thinned area than in the area of the bearing surface of the lens and/or than the wall thickness along the opening. The lens edge might in particular be the most critical area in terms of stresses in the glass of the lens and can be damaged in case of excessive stresses. The lens stem is arranged in the opening of the metal shell. It has a length advantageously corresponding to the thickness of the metal shell around the opening, that is the depth of the opening. The bearing surface of the lens is advantageously resting on the surface of the metal shell in the region around the opening and hence on the base described above and thus advantageously defines an annular bearing surface.

An equally critical area is the lens stem. Initial damages to the lens edge and/or to the lens stem may grow to result in damage to the entire lens. Damage to the lens can lead to a failure of the entire component.

In a lens cap having a thinned area according to the invention, mechanical stress in the regions of the lens edge and/or the lens stem is advantageously reduced by at least 30%, more advantageously by at least 40%, most advantageously by more than 50% compared to a lens cap without thinned area.

Accordingly, the lens is preferably designed as a lens with a lens stem that extends into the opening of the metal shell. Thus, a material bond between glass and metal additionally exists at the lateral walls of the opening.

The base on which the lens is seated preferably has a height of at least 0.03 mm, more preferably at least 0.04 mm. It will be understood that the height of the base corresponds to the depth of the thinned area.

BRIEF DESCRIPTION OF THE DRAWINGS

The subject matter of the invention will now be explained in more detail by way of two exemplary embodiments with reference to the drawings of FIGS. 1 to 4.

DETAILED DESCRIPTION

Figure 1:
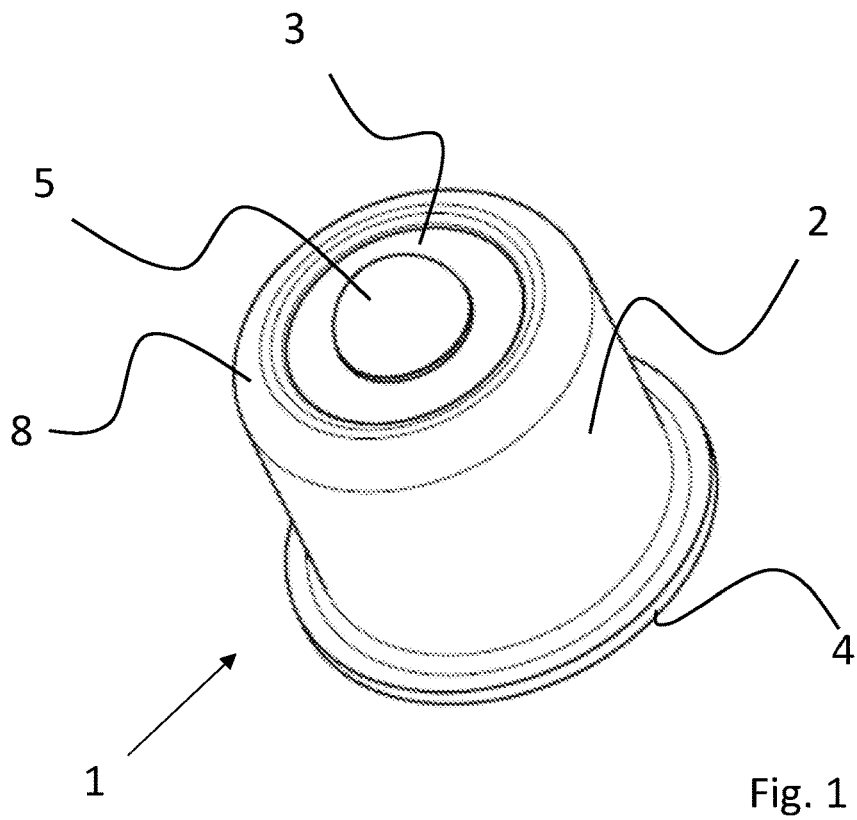
FIG. 1 shows a perspective view of a first exemplary embodiment of a lens cap.

FIG. 1 is a perspective view illustrating a lens cap 1 according to a first embodiment of the invention.

Lens cap 1 has a cup-shaped design and comprises a metal shell 2 of essentially circular cylindrical shape with a base wall 8 comprising a lens 5 arranged in the center thereof.

At a lower end, the metal shell 2 has a collar 4 via serves to secure the shell to the header of a TO package (not shown).

Metal shell 2 has an inner diameter and a height of less than 4 mm. A ratio of height to width of the shell is preferably between 7:3 and 3:7.

The wall thickness of the metal shell 2 is preferably less than 0.2 mm, more preferably less than 0.15 mm.

Already in this view it can be seen that an annular thinned area 3 in the form of a groove is provided around the lens 5, which serves to reduce stresses in the area of the lens 5, in particular in the area of lens edge 11.

Figure 2:
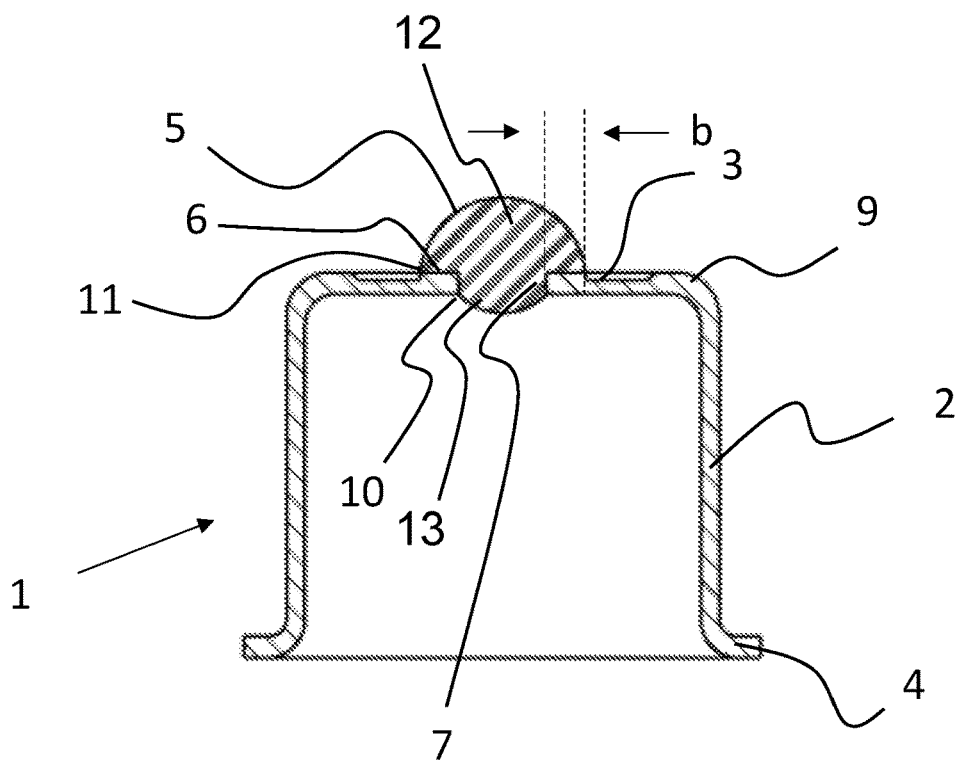
FIG. 2 is an axial sectional view of FIG. 1.

FIG. 2 is a sectional view of FIG. 1.

It can be seen that the metal shell 2 has a reduced thickness in the region of thinned area 3.

Therefore, lens 5 is seated on a base 6 immediately adjoining the thinned area 3. In this exemplary embodiment, base 6 and lens 5 are designed so that the lens edge 11 is arranged directly adjacent to the thinned area 3.

Lens 5 has been fused into the opening 10 and comprises a lens stem 7 extending into the opening 10 of metal shell 2. Lens stem 7 merges into a larger diameter section 12 and into a smaller diameter section 13 disposed inside the lens cap.

Base 6 preferably has a width b of at least 0.1 mm, more preferably at least 0.15 mm.

The corner 9 of metal shell 2 is preferably rounded.

It has been found that the mechanical stability of the lens cap 1 can be considerably increased already with a rather narrow thinned area 3.

What is decisive for the mechanical stability of lens cap 1 is the depth of the thinned area 3. The wall thickness in the thinned area should be reduced by at least 35%, preferably at least 40%, compared to the adjacent wall of base 6 and/or the adjacent non-thinned region of metal shell 2.

Figure 3:
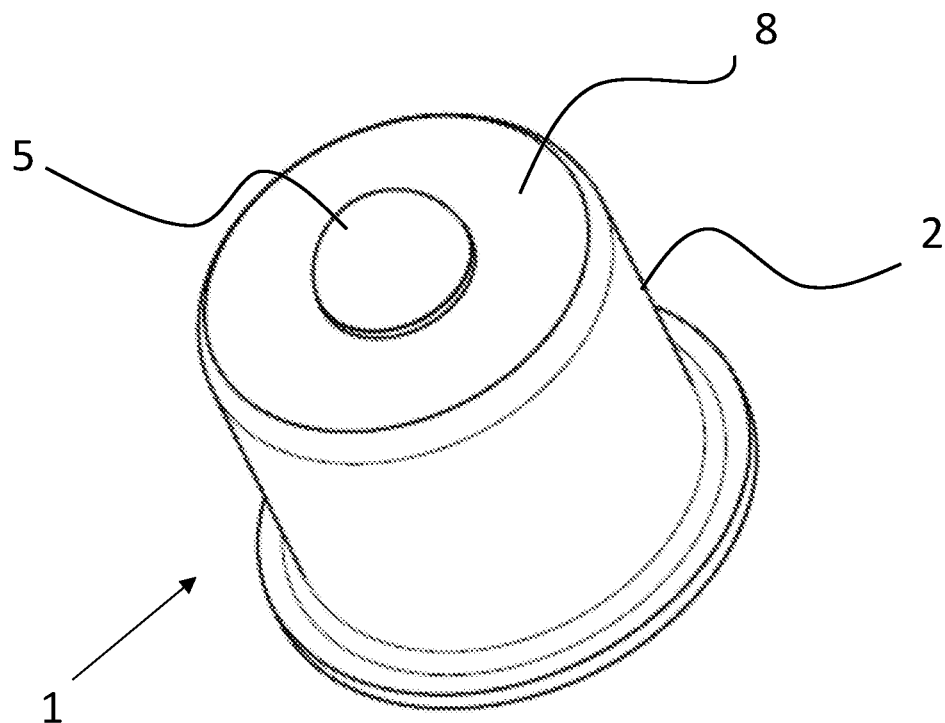
FIG. 3 shows a perspective view of an alternative embodiment of a lens cap.

FIG. 3 shows a perspective view of an alternative embodiment of the invention in which the entire base wall 8 of the metal shell around lens 5 is thinned, in contrast to the embodiment illustrated in FIGS. 1 and 2.

Figure 4:
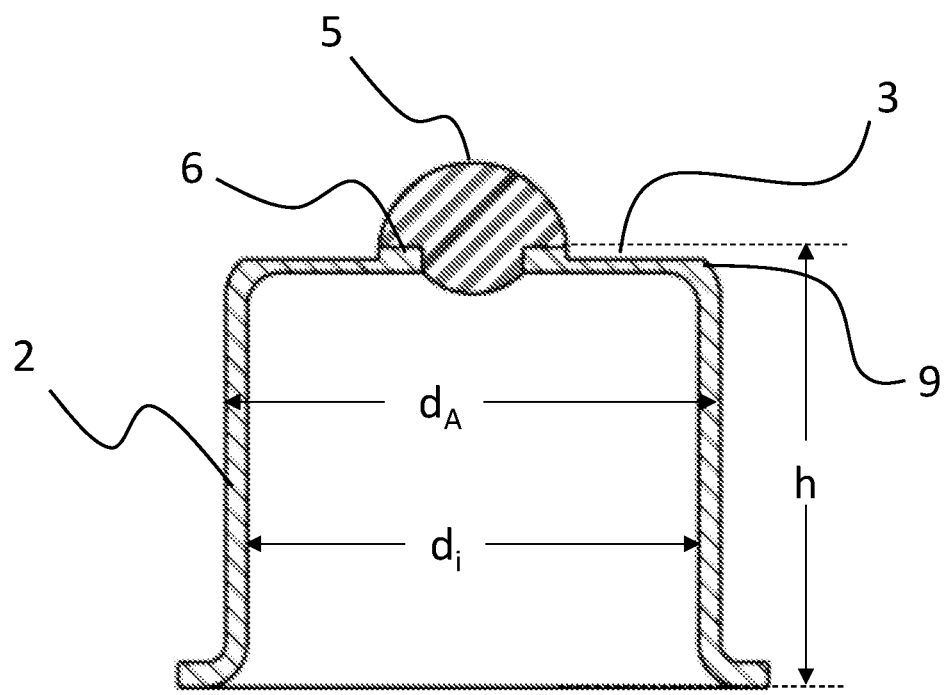
FIG. 4 is again a sectional view of FIG. 3.

FIG. 4 is a sectional view of FIG. 3.

It can be seen that the lens 5 is again seated on a base 6 in this embodiment.

Lens 5, or the upper section of the lens thus sits on a circular base 6 around which the material of metal shell 2 includes a thinned area 3 and is thinned as far as to the corner 9 in this embodiment.

This shell also has a diameter $d_i$ and a height h of less than 4 mm.

The outer diameter $d_A$ is defined as the outer diameter of the metal shell 2 above collar 4 which serves to secure the metal shell 2 to the header of a TO package.

The invention permits to provide even small lens caps of good mechanical stability.

LIST OF REFERENCE NUMERALS

1 Lens cap
2 Metal shell
3 Thinned area
4 Collar
5 Lens
6 Base
7 Lens stem
8 Base wall
9 Corner
10 Opening
11 Edge of lens
12 Larger diameter portion
13 Smaller diameter portion

What is claimed is:

1. A lens cap for a transistor outline package, comprising:
a metal shell having a lateral wall surrounding a base wall, the metal shell having an inner diameter of less than 4 mm at the lateral wall and a wall thickness of less than 0.2 mm at least at the base wall;
an opening in the base wall, wherein the base wall consists of a single thinned area surrounding the opening, the thinned area having a wall thickness that is reduced by at least 35% as compared to a wall thickness of other areas of the base wall, and wherein the base wall is thicker at the opening than at the thinned area; and
a lens seated in the opening.

2. The lens cap as claimed in claim 1, wherein the wall thickness of the thinned area is reduced by at least 40% as compared to a wall thickness of other areas of the base wall.

3. The lens cap as claimed in claim 1, wherein the wall thickness of the thinned area is reduced by at least 45% as compared to a wall thickness of other areas of the base wall.

4. The lens cap as claimed in claim 1, wherein the thinned area is an impression in a deep drawn component.

5. The lens cap as claimed in claim 1, wherein the thinned area is a groove extending around the lens.

6. The lens cap as claimed in claim 1, wherein the thinned area is a flattening of the base wall extending around the lens.

7. The lens cap as claimed in claim 1, wherein the lens has an outer diameter between 1 and 2 mm.

8. The lens cap as claimed in claim 1, wherein the metal shell is made of a material exhibiting a coefficient of linear thermal expansion that differs by not more than 1 ppm/K from a coefficient of linear thermal expansion of the lens.

9. The lens cap as claimed in claim 1, wherein the lens is fused to the base wall of the metal shell.

10. The lens cap as claimed in claim 1, wherein the lateral wall of the metal shell has a collar for securement of the lens cap to a header of the transistor outline package, and wherein the lens has a lens stem that is seated in the opening.

11. The lens cap as claimed in claim 1, wherein the transistor outline package is embodied as a TO-33 package.

12. The lens cap as claimed in claim 1, wherein the lens is made of borosilicate glass.

13. The lens cap as claimed in claim 1, wherein the metal shell is made of an iron-nickel alloy.

14. The lens cap as claimed in claim 1, wherein the lateral wall of the metal shell has a shell wall thickness of less than 0.15 mm.

15. A lens cap for a transistor outline package, comprising:
a metal shell having a lateral wall surrounding a base wall, the metal shell having an inner diameter of less than 4 mm at the lateral wall and a wall thickness of less than 0.2 mm at least at the base wall;
an opening in the base wall, wherein the base wall includes a thinned area surrounding the opening, the thinned area having a wall thickness that is reduced by at least 35% as compared to a wall thickness of other areas of the base wall, and wherein the base wall is thicker at the opening than at the thinned area; and
a lens seated in the opening, wherein the opening has a diameter that is 40 to 60% of an outer diameter of the lateral wall of the metal shell.

16. A transistor outline package comprising the lens cap as claimed in claim 1.

17. A lens cap for a transistor outline package, comprising:
a metal shell having a lateral wall surrounding a base wall, the metal shell having an inner diameter of less than 4 mm at the lateral wall and a wall thickness of less than 0.2 mm at least at the base wall;
an opening in the base wall, wherein the base wall has a thinned region spaced from the opening, the thinned region has a wall thickness that is reduced as compared to a wall thickness of other areas of the base wall; and
a lens seated in the opening, wherein the thinned region extends from the lens to the lateral wall without a step in the base wall.

18. The lens cap as claimed in claim 17, wherein the thinned region has a thickness that is reduced by at least 35% as compared to the other areas of the base wall.

19. The lens cap as claimed in claim 17, wherein the lens is fused to the base wall.

20. The lens cap as claimed in claim 17, wherein the thinned region is a flattening of the base wall extending around the other areas of the base wall.

* * * * *